United States Patent
Wang et al.

(10) Patent No.: US 7,259,102 B2
(45) Date of Patent: Aug. 21, 2007

(54) ETCHING TECHNIQUE TO PLANARIZE A MULTI-LAYER STRUCTURE

(75) Inventors: David C. Wang, Austin, TX (US); Frank Y. Xu, Round Rock, TX (US)

(73) Assignee: Molecular Imprints, Inc., Austin, TX (US)

( * ) Notice: Subject to any disclaimer, the term of this patent is extended or adjusted under 35 U.S.C. 154(b) by 8 days.

(21) Appl. No.: 11/240,708

(22) Filed: Sep. 30, 2005

(65) Prior Publication Data

US 2007/0077770 A1   Apr. 5, 2007

Related U.S. Application Data

(62) Division of application No. 11/240,707, filed on Sep. 30, 2005.

(51) Int. Cl.
*H01L 21/302* (2006.01)
(52) U.S. Cl. .............. 438/701; 438/702; 438/718; 438/719; 438/738
(58) Field of Classification Search ............ 438/701, 438/702, 718, 738, 719
See application file for complete search history.

(56) References Cited

U.S. PATENT DOCUMENTS

| | | | |
|---|---|---|---|
| 3,795,534 A | 3/1974 | Mehalso et al. |
| 4,038,110 A | 7/1977 | Feng |
| 4,267,212 A | 5/1981 | Sakawaki |
| 4,389,281 A | 6/1983 | Anantha et al. |
| 4,426,247 A | 1/1984 | Tamamura et al. |
| 4,507,331 A | 3/1985 | Hiraoka |
| 4,657,845 A | 4/1987 | Frchet et al. |
| 4,665,007 A | 5/1987 | Cservak et al. |
| 4,692,205 A | 9/1987 | Sachdev et al. |
| 4,741,926 A | 5/1988 | White et al. |
| 4,794,021 A | 12/1988 | Potter |
| 4,891,303 A | 1/1990 | Garza et al. |
| 4,931,351 A | 6/1990 | McColgin et al. |
| 4,943,516 A | 7/1990 | Kamayachi et al. |

(Continued)

FOREIGN PATENT DOCUMENTS

WO   WO 2005/031299 A2   4/2005

(Continued)

OTHER PUBLICATIONS

Kotachi et al., Si-Containing Positive Resist for ArF Excimer Laser Lithography, Photopolymer Science and Technology, pp. 615-622 Nov. 4, 1995.

(Continued)

*Primary Examiner*—Binh X. Tran
(74) *Attorney, Agent, or Firm*—Fish & Richardson P.C.; Kelly K. Kordzik (57) ABSTRACT

The present invention is directed to a method of etching a multi-layer structure formed from a layer of a first material and a layer of a second material differing from the first material to obtain a desired degree of planarization. To that end, the method includes creating a first set of process conditions to etch the first material, generating a second set of process conditions to etch the second material; and establishing an additional set of process conditions to concurrently etch the first and second materials at substantially the same etch rate.

12 Claims, 6 Drawing Sheets

U.S. PATENT DOCUMENTS

| | | | |
|---|---|---|---|
| 4,959,252 | A | 9/1990 | Bonnebat et al. |
| 4,976,818 | A | 12/1990 | Hashimoto et al. |
| 5,015,602 | A | 5/1991 | Van Der Plas et al. |
| 5,071,694 | A | 12/1991 | Uekita et al. |
| 5,110,514 | A | 5/1992 | Soane |
| 5,173,393 | A | 12/1992 | Sezi et al. |
| 5,198,326 | A | 3/1993 | Hashimoto et al. |
| 5,212,114 | A | 5/1993 | Grewal et al. |
| 5,234,793 | A | 8/1993 | Sebald et al. |
| 5,240,550 | A | 8/1993 | Boehnke et al. |
| 5,259,926 | A | 11/1993 | Kuwabara et al. |
| 5,276,126 | A | 1/1994 | Rogler |
| 5,314,772 | A | 5/1994 | Kozicki et al. |
| 5,330,883 | A | 7/1994 | Garza et al. |
| 5,434,107 | A | 7/1995 | Paranjpe |
| 5,480,047 | A | 1/1996 | Tanigawa et al. |
| 5,488,007 | A | 1/1996 | Kim et al. |
| 5,545,367 | A | 8/1996 | Bae et al. |
| 5,700,626 | A | 12/1997 | Lee et al. |
| 5,743,998 | A | 4/1998 | Park |
| 5,772,905 | A | 6/1998 | Chou |
| 5,888,650 | A | 3/1999 | Calhoun et al. |
| 5,893,750 | A | 4/1999 | Hause et al. |
| 5,895,263 | A | 4/1999 | Carter et al. |
| 5,905,104 | A | 5/1999 | Eklund et al. |
| 5,907,782 | A | 5/1999 | Wu |
| 5,954,997 | A | 9/1999 | Kaufman et al. |
| 5,986,330 | A | 11/1999 | Kalnitsky et al. |
| 6,033,977 | A | 3/2000 | Gutsche et al. |
| 6,046,056 | A | 4/2000 | Parce et al. |
| 6,074,827 | A | 6/2000 | Nelson et al. |
| 6,096,655 | A | 8/2000 | Lee et al. |
| 6,117,798 | A * | 9/2000 | Fang et al. ................. 438/782 |
| 6,232,175 | B1 | 5/2001 | Liu et al. |
| 6,326,627 | B1 | 12/2001 | Putvinski et al. |
| 6,329,256 | B1 | 12/2001 | Ibok |
| 6,334,960 | B1 | 1/2002 | Willson et al. |
| 6,342,097 | B1 | 1/2002 | Terry et al. |
| 6,387,787 | B1 | 5/2002 | Mancini et al. |
| 6,391,798 | B1 | 5/2002 | DeFelice et al. |
| 6,426,288 | B1 | 7/2002 | Meikle |
| 6,451,703 | B1 | 9/2002 | Liu et al. |
| 6,455,411 | B1 | 9/2002 | Jiang et al. |
| 6,468,896 | B2 | 10/2002 | Rohr et al. |
| 6,517,977 | B2 | 2/2003 | Resnick et al. |
| 6,562,465 | B1 | 5/2003 | Nakashima et al. |
| 6,645,879 | B2 * | 11/2003 | Hong et al. ................. 438/778 |
| 6,703,190 | B2 | 3/2004 | Elian et al. |
| 6,716,767 | B2 | 4/2004 | Shih et al. |
| 6,719,915 | B2 | 4/2004 | Willson et al. |
| 6,730,256 | B1 | 5/2004 | Bloomstein et al. |
| 6,737,202 | B2 | 5/2004 | Gehoski et al. |
| 6,743,713 | B2 | 6/2004 | Mukher-Hee-Roy et al. |
| 6,767,983 | B1 | 7/2004 | Fujiyama et al. |
| 6,777,170 | B1 | 8/2004 | Bloomstein et al. |
| 6,814,879 | B2 | 11/2004 | Shibata |
| 6,820,677 | B2 | 11/2004 | Grinberg et al. |
| 6,893,975 | B1 | 5/2005 | Yue et al. |
| 6,894,245 | B2 | 5/2005 | Hoffman et al. |
| 7,041,604 | B2 | 5/2006 | Miller et al. |
| 2003/0129542 | A1 | 7/2003 | Shih et al. |
| 2004/0029041 | A1 | 2/2004 | Shih et al. |
| 2004/0029372 | A1 | 2/2004 | Jang et al. |
| 2004/0029396 | A1 | 2/2004 | Zhang et al. |
| 2004/0142501 | A1 * | 7/2004 | Nakai et al. ................. 438/22 |
| 2004/0188381 | A1 | 9/2004 | Sreenivasan |
| 2004/0211754 | A1 | 10/2004 | Sreenivasan |
| 2004/0224261 | A1 | 11/2004 | Resnick et al. |
| 2004/0250945 | A1 | 12/2004 | Zheng et al. |
| 2005/0199341 | A1 | 9/2005 | Delp et al. |
| 2005/0253307 | A1 | 11/2005 | Sreenivasan |
| 2005/0260848 | A1 | 11/2005 | Sreenivasan |

FOREIGN PATENT DOCUMENTS

| | | |
|---|---|---|
| WO | WO 2005/031855 A1 | 4/2005 |

OTHER PUBLICATIONS

Haisma et al., Mold-assisted Nanolithography: A Process for Reliable Pattern Replication, J. Vac. Sci. Technol. B, pp. 4124-4128 Nov. 1, 1996.

Lin, Multi-Layer Resist Systems, Introduction to Microlithography, pp. 287-349 Feb. 14, 1983.

Nerac.com Retro Search, Reduction of Dimension of Contact Holes, Aug. 31, 2004.

Nerac.com Retro Search, Trim Etching of Features Formed on an Organic Layer, Sep. 2, 2004.

Luurtsema, Spin Coating for Rectangular Substrates, Retrieved May 23, 2002 from URL: http://buffy.eecs.berkelye.edu/IRO/Summary/97abstracts/gluurts.2.html May 23, 2002.

Photoresist Coating Methods, e-mail from Susan Bagen(BAGEN@aol.com) to Dhaval Shah Sep. 18, 1997.

Nakamatsu et al., Bilayer Resist Method for Room-Temperature Nanoimprint Lithography, Japanese Journal of Applied Physics, vol. 43, No. 6B, pp. 4050-4053 Jun. 29, 2004.

U.S. Appl. No. 10/946,565, naming Inventors Vidusek et al., entitled Method of Forming an In-Situ Recessed Structure, filed Sep. 21, 2004.

U.S. Appl. No. 10/946,577, naming Inventors Sreenivasan et al., entitled Reverse Tone Patterning on Surfaces Having Surface Planarity Pertubations, filed Sep. 21, 2004.

U.S. Appl. No. 10/946,566, naming Inventors Sreenivasan et al., entitled Pattern Reversal Employing Thick Residual Layers, filed Sep. 21, 2004.

U.S. Appl. No. 10/946,574, naming Inventors Stacey et al., entitled Patterning Substrates Employing Multi-Film Layers Defining Etch-Differential Interfaces, filed Sep. 21, 2004.

Data Sheet for MAK (Methyl n-Amyl Ketone), www.sp-chem.com/fine_e Jan. 1, 2003.

Data Sheet for gamma-Glycidoxypropyltrimethoxysilane, www.powerchemical.net/3100.htm Dec. 5, 2003.

Silicon or Silica, www.mii.org/Minerals/photosil Mar. 31, 2005.

Electronic Devices and Circuits, people.deas.harvard.edu/~jones/es154/lectures/lecture_2/materials/materials.html Mar. 31, 2005.

Data Sheet for Cymel 303ULF, www.cytec.com, 2000.

Data Sheet for Cycat 4040, www.cytec.com, 1990.

International Chemical Safety Card for p-Toluenseulfonic Acid, www.itcilo.it/english/actrav/telearn/osh/ic/104154.htm Dec. 5, 2003.

Data Sheet for p-Toluenesulfonic Acid, NIOSH Manual of Analytical Methods (NMAM), Fourth Edition, 1998.

Data Sheet for Dow Corning Z-6018, no date.

Data Sheet for Methyl Amyl Ketone, www.arb.ca.gov/db/solvents/solvent_pages/Ketones-HTML/methyl_amyl.htm Mar. 31, 2005.

U.S. Appl. No. 11/184,664, naming Inventors LaBrake, entitled Method of controlling the critical dimension of structures formed on a substrate, filed Jul. 19, 2005.

Miller et al., Fabrication of Nanometer Sized Features on Non-Flat Substrates Using a Nano-Imprint Lithography Process, SPIE Microlithography Conference Feb. 1, 2005.

Stewart et al., Direct Imprinting of Dielectric Materials for Dual Damascene Processing, SPIE Microlithogrpahy Conference Feb. 1, 2003.

Smith et al., Employing Step and Flash Imprint Lithography for Gate Level Patterning of a MOSFET Device, SPIE Microlithography Conference Feb. 1, 2003.

Peurrung et al., Film Thickness Profiles over Topography in Spin Coating, J. Electrochem. Soc., vol. 138, No. 7 Jul. 1, 1991.

U.S. Appl. No. 11/240,707, naming Inventors Xu et al., entitled Deposition Technique to Planarize a Multi-Layer Structure, filed Sep. 30, 2005.

Wolf et al., Silicon Processing for the VLSI era, vol. 1; Process Technology, pp. 546-547 Jan. 1, 1986.

* cited by examiner

*FIG. 8*

ETCHING TECHNIQUE TO PLANARIZE A MULTI-LAYER STRUCTURE

CROSS-REFERENCE TO RELATED APPLICATIONS

The present application is a divisional of U.S. patent application Ser. No. 11/240,707 filed Sep. 30, 2005, entitled DEPOSITION TECHNIQUE TO PLANARIZE A MULTI-LAYER STRUCTURE, listing Frank Y. Xu and Edward B. Fletcher as inventors, which application is incorporated by reference herein.

STATEMENT REGARDING FEDERALLY SPONSORED RESEARCH OR DEVELOPMENT

The United States government has a paid-up license in this invention and the right in limited circumstance to require the patent owner to license others on reasonable terms as provided by the terms 70NANB4H3012 awarded by the National Institute of Standards and Technology (NIST).

BACKGROUND OF THE INVENTION

This invention relates to spin-on coating of substrates. Specifically, the present invention is directed to a method to coat a substrate employing spin-on techniques in furtherance of lithographic patterning.

Spin-coating is a well known technique employed to form a layer of material upon a substrate. Often the material is deposited upon a surface having anisotropic topography in furtherance of producing a film having a planar surface disposed opposite to the substrate surface. The planarity of the material surface is highly desirable for several processes, e.g., deposition of resist material in furtherance of patterning. As a result, studies have been undertaken to understand the behavior of films formed during spin-coating. Peurrung and Graves in *Film Thickness Profiles over Topography in Spin Coating*, Journal of the Electrochemical Society, Vol. 138 No. 7 (1991), set forth a theoretical analysis of spin-coating wet films over anisotropic surfaces. Peurrung and Graves conclude that the presence of anisotropicity of the substrate surface makes problematic production of a planar material surface. Many attempts have been undertaken to obtain a planar material surface from material spin-coated on an anisotropic surface.

U.S. Pat. No. 4,038,110 discloses a technique to planarize an anisotropic substrate surface that involves forming a photoresist pattern in registration with a pattern of unelevated areas present on the substrate. The photoresist pattern has narrower lateral dimensions than an elevated pattern whereby registration is facilitated. The photoresist pattern is flowed to laterally expand the photoresist and mask the unelevated areas.

In U.S. Pat. No. 4,741,926, one manner in which to overcome the drawbacks with multi-layer resists involves spreading a resin material over an anisotropic surface employing a dual spin cycle. The resin material is spread at a speed of approximately not less than 4000 revolutions per minute (rpm), preferably from 6000 to 8000 rpm, until build-up of the coating is detectable on a side wall of a topographical feature facing the centrifugal center of the spinning substrate. The spin speed is immediately reduced to less than 4000 rpm, preferably from about 1000 to 3500 rpm, and spinning is continued for a time sufficient to dry the coating.

U.S. Pat. No. 4,794,021 discloses a method of forming a planarized layer on a substrate by spin-coating a polymer over the substrate. Before the layer dries the substrate is heated in a pressure-controlled environment to control solvent loss while maintaining the polymer in a liquid state. After a predetermined interval of time, the substrate is cured in a standard conventional bake oven.

U.S. Pat. No. 5,736,424 discloses a method that includes contacting a material having a predetermined viscosity with an object having a flat surface. The material has a viscosity less than 1000 cp, and a flat surface is placed into contact with the material in such a manner that the material is planarized to a desired degree. The material is cured while in contact with the flat surface. The object is then separated from the material. The planarity of the planarizing material is then transferred into the underlying layer using conventional techniques.

U.S. Pat. No. 5,893,750 discloses a method of forming a planarized interlevel dielectric layer over interconnects formed upon a frontside surface of an upper topography of a silicon wafer. An anisotropic silicon dioxide (oxide) layer is first deposited over the interconnects. A spin-on glass (SOG) layer is then formed over the anisotropic oxide layer. The liquid SOG material flows over the upper surface, filling narrow spaces without creating voids and producing a surface smoothing effect at isolated vertical edges. After curing of the SOG layer, a chemical-mechanical polishing (CMP) process is applied to the frontside surface. The CMP process increases the planarity of the frontside surface by reducing surface heights of elevated features more so than surface heights in recessed areas. A need exists, however, to provide improved planarization techniques.

SUMMARY OF THE INVENTION

The present invention is directed to a method of etching a multi-layer structure formed from a layer of a first material and a layer of a second material differing from the first material to obtain a desired degree of planarization. To that end, the method includes creating a first set of process conditions to etch the first material, generating a second set of process conditions to etch the second material; and establishing an additional set of process conditions to concurrently etch the first and second materials at substantially the same etch rate. The first set of process conditions are produced to etch the first material and expose a multi-material surface containing both the first and second materials. The additional set of process conditions is established to concurrently etch the first and second materials at substantially the same etch rate to remove substantially all of the first material to produce a semi-planar surface. The second set of process conditions are to form, from the semi-planar surface, a planarized surface having the desired degree of planarization that is established by the smoothing surface of the multi-layered structure. These and other embodiments are discussed more fully below.

DETAILED DESCRIPTION OF THE INVENTION

Figure 1:
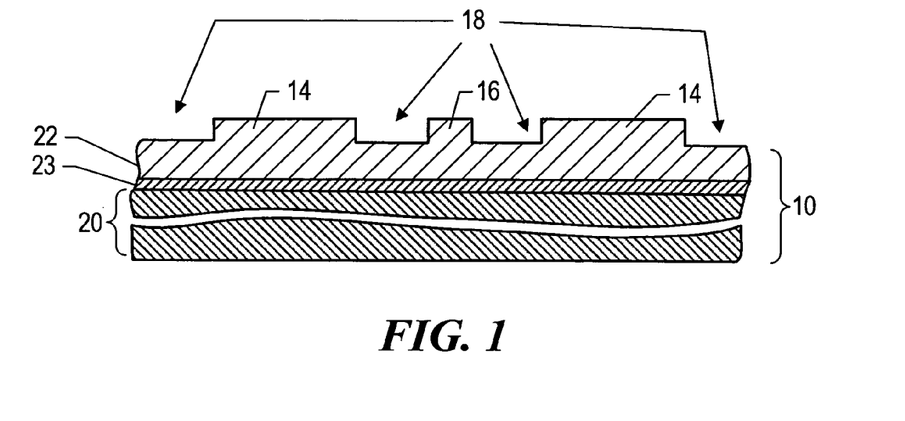
FIG. 1 is a cross-sectional view of a substrate having an anisotropic surface that is to be planarized in accordance with the present invention.

Referring to FIG. 1, in certain patterning processes it is desired to form a planar surface upon substrates, such as substrate 10, having an anisotropic surface. The anisotropic surface may include spaced-apart projections 14 and 16, defining spaced-apart recessions 18, which may result from any known previous patterning process. Projections 14 may be metal lines, photoresist, monocrystalline silicon and the like. In the present example, substrate 10 is discussed as including a wafer 20 formed from standard materials, e.g., mono-crystalline silicon. Present upon wafer 20 is a patterned layer 22 in which projections 14 and 16 are formed. In the present example it is desired to form a planarized surface, referred to as a crown surface 25, in which substantially the entire surface area of an apex surface 24 of projections 14 and substantially the entire surface area of an apex surface 26 of projections 16 are exposed and coplanar with a surface 28 of a material deposited to fill recessions 18. To that end, in an exemplary embodiment, patterned layer 22 is formed from a solidified polymeric material employing imprint lithography techniques, with a primer layer 23 being disposed between patterned layer 22 and wafer 20. Primer layer 23 is typically formed from spin-coating a layer of DUV30J-16. DUV30J-16 is a bottom anti-reflective coating, BARC, available from Brewer Science in Rolla, Mo. An exemplary bulk material from which to form patterned layer 22 is as follows:

Patterned Layer Bulk Imprinting Material isobornyl acrylate n-hexyl acrylate ethylene glycol diacrylate 2-hydroxy-2-methyl-1-phenyl-propan-1-one

FS-2000

The acrylate component, isobornyl acrylate (IBOA), has the following structure:

and comprises approximately 47% of bulk material by weight, but may be present in a range of 20% to 80%, inclusive. As a result, the mechanical properties of patterned layer 22 are primarily attributable to IBOA. An exemplary source for IBOA is Sartomer Company, Inc. of Exton, Pa. available under the product name SR 506.

The component n-hexyl acrylate (n-HA) has the following structure:

and comprises approximately 25% of bulk material by weight, but may be present in a range of 0% to 50%, inclusive. Also providing flexibility to patterned layer 22, n-HA is employed to reduce the viscosity of the prior art bulk material so that bulk material, in the liquid phase, has a viscosity in a range of 2-9 Centipoises, inclusive. An exemplary source for the n-HA component is the Aldrich Chemical Company of Milwaukee, Wis.

A cross-linking component, ethylene glycol diacrylate, has the following structure:

and comprises approximately 25% of bulk material by weight, and may be present in a range of 10% to 50%, inclusive. EGDA also contributes to the modulus and stiffness buildup, as well as facilitates cross-linking of n-HA and IBOA during polymerization of the bulk material.

An initiator component, 2-hydroxy-2-methyl-1-phenyl-propan-1-one is available from Ciba Specialty Chemicals of Tarrytown, N.Y. under the tradename DAROCUR® 1173, and has the following structure:

and comprises approximately 3% of the bulk material by weight, and may be present in a range of 1% to 5%, inclusive. The actinic energy to which the initiator is responsive is broadband ultra-violet energy generated by a medium-pressure mercury lamp. In this manner, the initiator facilitates cross-linking and polymerization of the components of the bulk material. The component FS-2000 is a surfactant that provides preferential adhesion and release upon polymerization of the bulk material. FS-2000 is sold by Mason Chemical Company of Arlington Heights, Ill. under the product name MASURF® FS-2000 and comprises approximately 2% of the bulk material by weight, and may be present in a range of 0.1% to 5%, inclusive. An exemplary imprint lithography technique to deposit patterned layer 22 is disclosed in co-pending U.S. patent application Ser. No.

11/068,171, filed Feb. 28, 2005, entitled "Composition to Reduce Adhesion Between a Conformable Region and a Mold," having Frank Xu and Michael N. Miller listed as inventors, which is incorporated by reference herein.

Figure 3:
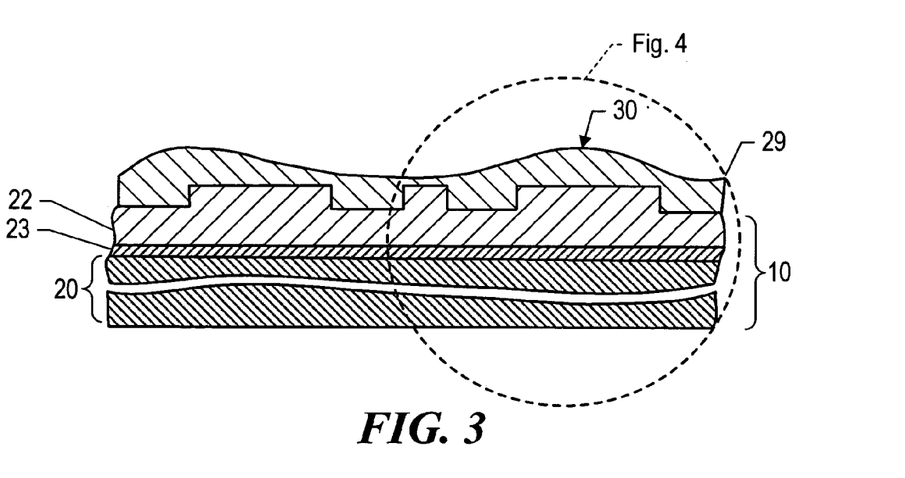
FIG. 3 is a cross-sectional view of the substrate shown in FIG. 1 having a semi-conformal layer deposited therein.

In furtherance of forming crown surface 25, projections 14 and 16 are covered, and recessions 18 filled, with a polymerizable material, referred to herein as a semi-conformal composition, which is applied by spin-coating to form semi-conformal layer 29. In the present example, semi-conformal layer 29 is formed from a silicon-containing polymerizable material employing a Brewer Science Model CEE® 4000 spin-coating system. The polymerizable material is centrally disposed on substrate 10 before rotation occurs. After dispensing of the polymerizable material, substrate 10 is accelerated 3,000 revolutions per minute (rpm) per second to reach a maximum rotational velocity of approximately 1000 rpm. The maximum rotational velocity is maintained until substantially all of the solvent in the polymerizable material has been removed. This is detected optically by the unaided eye as the color of semi-conformal layer 29 remaining substantially unchanged during rotation of substrate 10. Following removal of the solvent, substrate 10 is placed upon a heating device (not shown), such as a hot plate, to raise the temperature thereof, by conductive heating, to approximately 180° C. for 60 seconds.

An exemplary bulk material to include in the semi-conformal composition to form semi-conformal layer 29 is as follows:

Semi-Conformal Layer Bulk Material hydroxyl-functional polysiloxane hexamethoxymethylmelamine toluenesulfonic acid The hydroxyl-functional polysiloxane component is present in SEMI-CONFORMAL BULK MATERIAL in amounts of approximately 80% by weight of SEMI-CONFORMAL BULK MATERIAL, but may be present in a range of 40 to 95%, inclusive by weight, depending on the thicknesses desired for semi-conformal layer 29. An exemplary hydroxyl-functional polysiloxane component used in the present invention is a silicon T-resin intermediate available from Dow Corning® (Midland, Mich.) under the tradename Z-6018.

The hexamethoxymethylmelamine(HMMM) is a cross-linking agent component and is present in SEMI-CONFORMAL BULK MATERIAL in amounts of approximately 19% by weight of SEMI-CONFORMAL BULK MATERIAL, but may be present in a range of 10 to 30%, inclusive by weight. An exemplary HMMM component is available from Cytec Industries, Inc. (West Paterson, N.J.) under the tradename CYMEL 303ULF.

The toluenesulfonic acid component is a catalyst present in the SEMI-CONFORMAL LAYER BULK MATERIAL in an amount of component and is present in SEMI-CONFORMAL BULK MATERIAL in amounts of approximately 1% by weight of SEMI-CONFORMAL BULK MATERIAL, but may be present in a range of 1 to 2%, inclusive by weight. An exemplary catalyst is available from Cytec Industries, Inc. (West Paterson, N.J.) under the tradename CYCAT 4040.

Typically, the SEMI-CONFORMAL LAYER BULK MATERIAL is employed with a solvent to form the semi-conformal composition employed to form semi-conformal layer 29. The solvent may be present in the semi-conformal composition in amounts of approximately 60% to 98% by weight, dependent upon the desired thicknesses of semi-conformal layer 29, with the remaining portions of the semi-conformal composition being the SEMI-CONFORMAL LAYER BULK MATERIAL 58. An example of a solvent used in the present invention is methyl amyl ketone available from Aldrich Co. (St. Louis, Mo.) under the tradename MAK.

Figure 4:
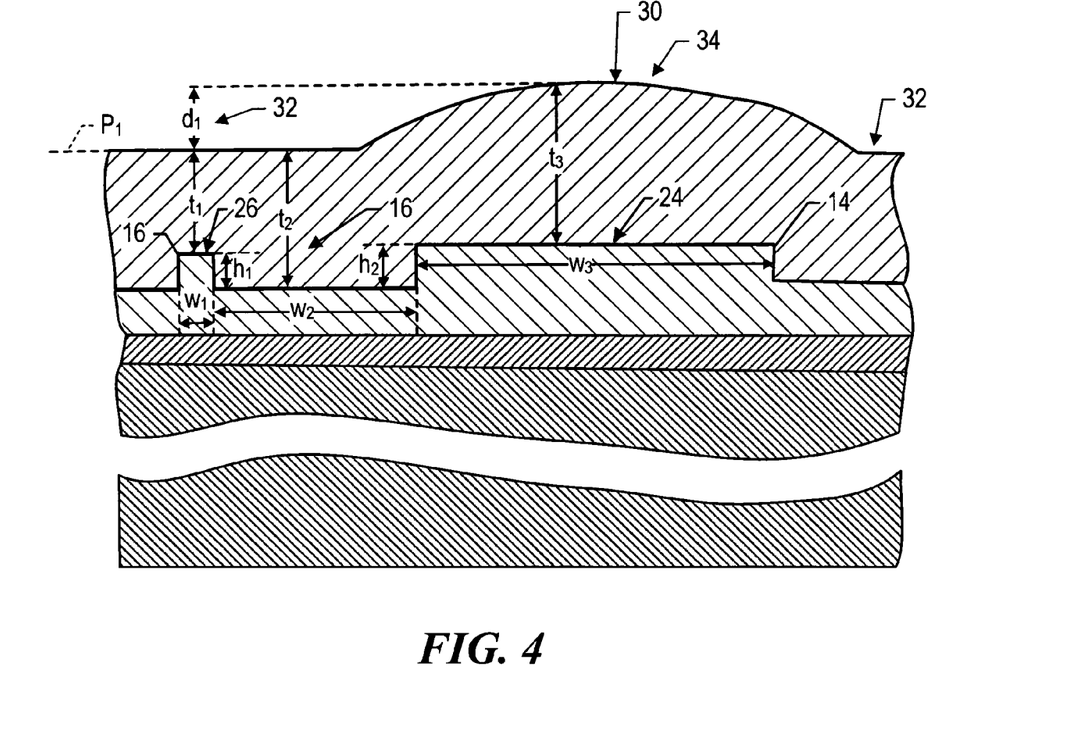
FIG. 4 is a detailed cross-sectional view of a region of the substrate shown in FIG. 3.

The anisotropy of surface of substrate 10 causes thickness variations in semi-conformal layer 29 that present as troughs 32 and hills 34. It was observed that regions of a surface 30 of semi-conformal layer 29 in superimposition with projection 16 and recession 18 had a substantially smooth, if not planar surface, because projection 16 has small lateral dimension, $w_1$. This results in a thickness $t_1$ of semi-conformal layer 29, measured between surface 30 and apex surface 26 of projection 16, being substantially equal to thickness $t_2$-$h_1$, with $h_1$ being the height of projection 16. This was observed for projections, such as projection 16, having a width, $w_1$, of several microns or less, which is smaller than width, $w_2$, of recession 18. Projections, such as projection 14, having a width, $w_3$, which is tens of microns or larger, were observed to produce hills, such as hill 34. Hill 34 is defined by a region of semi-conformal layer 29 having a varying thickness measured with respect to apex surface 24 of projection 14 and surface 30. The maximum thickness, $t_3$, of the region of semi-conformal layer 29 in superimposition with projection 14, is approximately equal to thickness $t_2$. The portion of surface 30 associated with the maximum thickness of hill 34 is spaced-apart from a plane $P_1$ in which the remaining regions of surface 30 lie, a distance $d_1$. Typically, $d_1$ is approximately equal to height, $h_2$, of projection 14. As a result, a blanket etch to expose the entire area of apex surface 30 and hill 34 would result in projection 16 being lost (removed through the etching process) due to the presence of hill 34 in furtherance of forming crown surface 25. This is undesirable.

Figure 2:
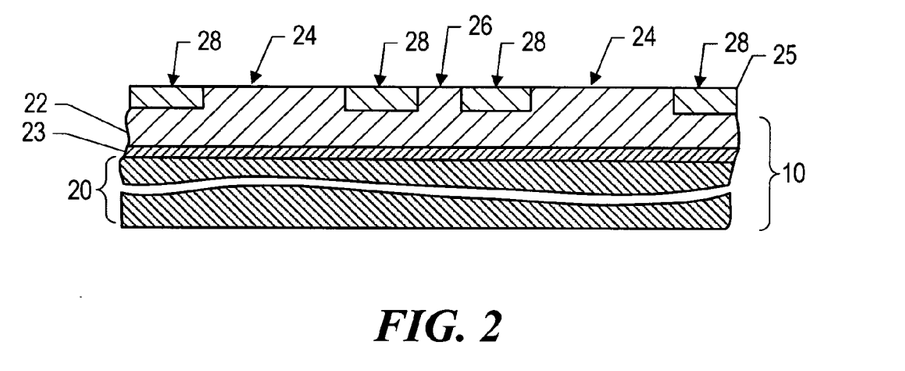
FIG. 2 is a cross-sectional view of the substrate shown in FIG. 1 having a planarized surface, in accordance with the present invention.
Figure 5:
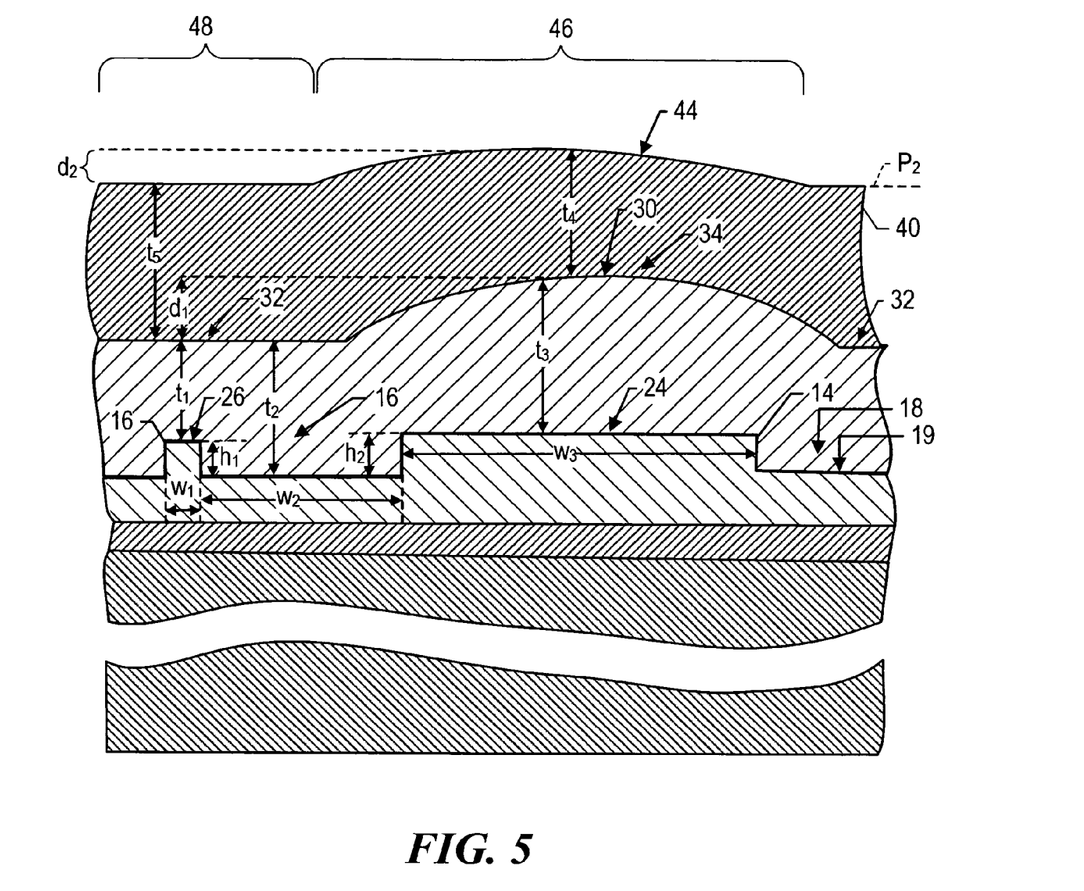
FIG. 5 is a cross-sectional view of the substrate shown in FIG. 4 having a smoothing layer deposited thereon.

Referring to both FIGS. 2, 4 and 5, to minimize, if not prevent, the portion of projection 16 that is removed upon exposure of the entire area of apex surface 34, an additional layer, referred to as smoothing layer 40, is disposed upon surface 30. Smoothing layer 40 functions to further reduce non-planarity perturbations in surface 30 due, for example, to troughs 32 and hills 34. To that end, smoothing layer 40 is typically disposed on surface 30 employing spin-on techniques to minimize the time required to form the same. As a result, the material from which smoothing layer 40 is formed includes a solvent. It is desired to form smoothing layer 40 from a material that maintains a fluidic state after spin-on coating has effectively removed substantially all of the solvent present therein. This minimizes non-planarity perturbations present in a smoothing surface 44 resulting from smoothing layer 40 after formation thereof by maximizing leveling of smoothing surface 44 in the absence of centrifugal forces. This is based upon the realization that conformal coating dominates in the presence of centrifugal forces and planarization dominates in the presence of capillary forces. A ratio of centrifugal force ($F_C$) to capillary force ($F_P$) is proportional to the cubic of feature lateral dimension, (w) that may be expressed as follows:

$$F_C/F_P \alpha w^3 \quad \quad 1)$$

To avoid the deleterious effects of centrifugal forces, the material from which smoothing layer 40 is formed maintains a fluidic state after spin-on coating has effectively removed substantially all of the solvent present therein.

An exemplary bulk material from which to form smoothing layer 40 is as follows:

Smoothing Layer Bulk Material 1 cycloaliphatic epoxy

ω-caprolactone triol photoinitiator fluorosurfactant

The cycloaliphatic epoxy component has the following structure:

The cycloaliphatic epoxy component comprises approximately 87% of bulk material by weight. As a result, the mechanical properties of smoothing layer 40 are primarily attributable to the cycloaliphatic epoxy component. An exemplary source of the cycloaliphatic epoxy component is sold by Dow Chemical Company of Midland, Mich. as chemical name 3,4-epoxycyclohexylmethyl-3,4-epoxycyclohexane carboxylate and sold under the tradename ERL-4221LV.

The ω-caprolactone triol component comprises approximately 10% of the bulk material by weight. This component increased the catioinic curing speed of SMOOTHING LAYER BULK MATERIAL 1. An exemplary source of the ω-caprolactone triol component is sold by Dow Chemical Company of Midland, Mich. under the tradename Tone 0301.

The photoinitiator component comprises approximately 3% of the bulk material by weight and facilitates crosslinking and polymerization of the remaining components of bulk material in response to actinic energy. An exemplary photoinitiator is a cationic photoinitiator comprising a mixture of triarylsulfonium hexafluorophosphate salts in a propylene carbonate. An exemplary source of the photoinitiator component has the following structure:

-continued and is sold by Dow Chemical Company of Midland, Mich. under the tradename UVI 6992.

The fluorosurfactant component is a nonionic fluorinated acrylic copolymer based surfactant that comprises less than 1% of the bulk material by weight. An exemplary fluorosurfactant is available from Dainippon Ink & Chemical of Japan under the tradename MegaFace™ R-08.

Typically, the SMOOTHING LAYER BULK MATERIAL is employed with a solvent to form a smoothing composition employed to form smoothing layer 40. The solvent may be present in the smoothing composition in amounts of approximately 20% to 98% by weight, dependent upon the desired thicknesses of smoothing layer 40, with the remaining portions of the semi-conformal composition being the SMOOTHING LAYER BULK MATERIAL. An example of a solvent used in the present invention is methyl amyl ketone available from Aldrich Co. (St. Louis, Mo.) under the tradename MAK.

Surface 30 is coated with the smoothing composition by spin-on techniques employing a Brewer Science Model CEE® 4000 spin-coating system to form smoothing layer 40. The smoothing composition is centrally disposed on surface 30 before rotation occurs. After dispensing of the smoothing composition, substrate 10 is accelerated 5,000 revolutions per minute (rpm)/s to reach a maximum rotational velocity of approximately 4000 rpm. The maximum rotational velocity is maintained until substantially all of the solvent in the polymerizable composition has been removed. This is detected optically by the unaided eye as the color of semi-conformal layer 29 remains substantially unchanged during rotation of substrate 10. Thereafter, rotation of substrate 10 is ceased and leveling of smoothing surface 44 is allowed to occur in the absence of movement of substrate 10. Typically, leveling occurs for 2-30 minutes and at ambient atmospheric conditions, i.e., ambient temperatures and pressures. Exemplary ambient temperatures and pressures are 25° Celsius and 760 Torr, respectively. After the desired leveling time has occurred, smoothing layer 40 is exposed to broadband ultraviolet energy for approximately 120 seconds with a lamp intensity of 20 mW/cm$^2$ to polymerize and cross-link the smoothing composition. This is typically achieved employing a light source sold by OAI of San Jose, Calif. as Model 30 LS that may produce an 8-inch uniform beam.

Hill 34 causes regions 46 of smoothing surface 44 to have a varying thickness measured with respect to surface 30. The thickness, $t_4$, differs from a thickness, $t_5$, of regions 48 of smoothing layer 40 outside of region 46. This results in the portion of surface 44 associated with the maximum thickness of region 46 being spaced-apart from a plane, $P_2$, in which the remaining regions of surface 46 lie, a distance $d_2$. The bulk material from which smoothing layer 40 is fabricated facilitates, for a given deposition process, to ensure that thickness, $t_4$, is less than thickness, $t_5$; hence, $d_1$ is greater than $d_2$. This effectively reduces the thickness offset between exposed surfaces, in this case smoothing surface 44 and both, nadir surface 19 of recession 18, and apex surface 24.

Assuming smoothing layer 40 and semi-conformal layer 29 have substantially similar etch characteristics, e.g., etch rate for a given etch recipe or groups of etch recipes, the presence of smoothing layer 40 reduces the magnitude of over-etch to which the projection 16 is subject when exposing apex surface 24. The reduction would be the absolute value of the difference between $d_1$ and $d_2$. For example, assuming height $h_2$ is 100 nanometers (nm), $d_1$ would be approximately 100 nm. It was found that depositing smoothing layer 40 with a thickness, $t_5$, being approximately 500 nm, provided thickness, $t_4$, of approximately 440 nm. As a result, $d_2$ is approximately 60 nm. This amounts to a 60% improvement of the degree of planarization (DOP). In the absence of smoothing layer 40, the DOP may be defined as follows:

$$DOP = (t_2 - t_3)/h_2 \times 100\% \quad (2)$$

with $t_2$, $t_3$ and $h_2$ shown in FIG. 5. With the presence of smoothing layer 40, the DOP may be defined as follows:

$$DOP = [t_2 + (d_1 - d_2) - t_3]/h_2 \times 100\% \quad (3)$$

Assuming projection 16 has a height, $h_1$, of 100 nm, the presence of smoothing layer 40 would result in projection 16 having a height, $h_1$, of approximately 60 nm upon exposure of surface 34.

Further planarization benefit may be obtained by taking advantage of etch rate differential provided by differing etch recipes. For example, assuming that semi-conformal layer 29 had an etch rate, for a given etch recipe, that was 20% faster than the associated etch rate of smoothing layer 40, it may be seen that the reduction in height, $h_1$, may be further reduced by 12 nm, i.e., height $h_1$ of projection 16 is approximately 72 nm upon exposure of the entire area of surface 34. This may be desirable. Conversely, were the etch rate associated with semi-conformal layer 29, for a given etch recipe, 20% slower that the associated etch rate of smoothing layer 40, the planarization benefits of smoothing layer 40 may be reduced. The height, $h_1$, of projection 16 would be reduced by 12 nm so that $h_1$ would be reduced to 48 nm upon exposure of the entire surface 34.

Figure 6:
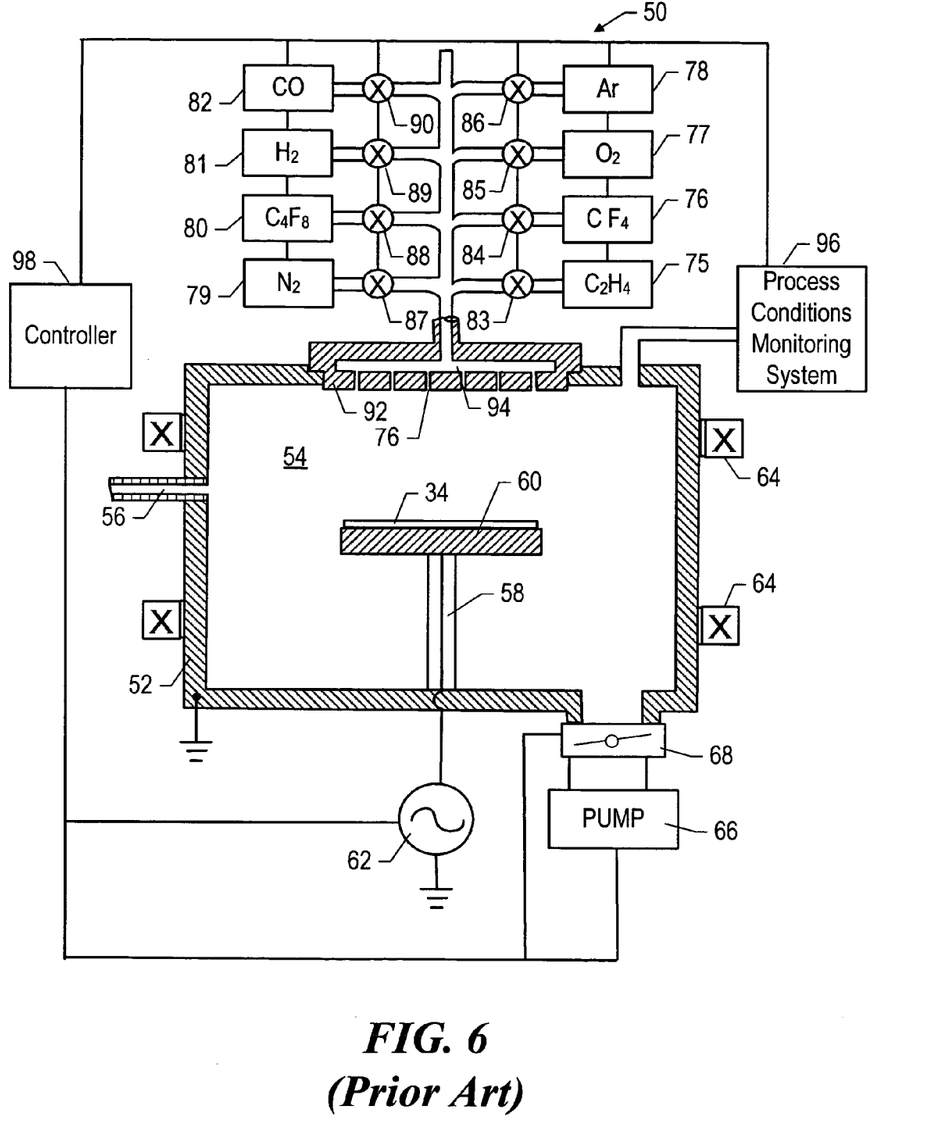
FIG. 6 is a cross-sectional view of a prior art etching chamber.

Referring to FIGS. 5 and 6, matching the etch characteristics of the materials of semi-conformal layer 29 and smoothing layer 40 may be problematic. As a result, an etch recipe has been developed that compensates for the etch rate differential presented by semi-conformal layer 29 and smoothing layer 40 so that both etch at substantially the same rates. To that end, an etching system, such as a magnetically-enhanced reactive ion etching (MERIE) reactor 50 is employed. Reactor 50 includes grounded walls 52 defining a chamber 54 and slit valve opening 56 allowing ingress to and egress from chamber 54. Disposed within chamber 54 is a cathode pedestal 58 with an electrostatic chuck 60 selectively clamping the wafer that may be coupled to a power source (not shown). Cathode pedestal 58 may include channels (not shown) through which coolant fluid (not shown), flows to facilitate control of the temperature of the chuck. An RF power supply 62 is in electrical communication with cathode pedestal 58 to facilitate control of the DC bias to chuck 40 and generation of a plasma within chamber 54. A vacuum pump system 66 pumps the chamber 54 through an adjustable throttle valve 68.

Processing gases are supplied from gas sources 75-82 through respective mass flow controllers 83-90 to a quartz gas distribution plate 92 positioned opposite to chuck 60. The distribution plate 92 includes a manifold 94 receiving the processing gas and communicating with chamber 54 through a showerhead having a large number of distributed apertures 96 so as to inject a more uniform flow of processing gas into chamber 54. During operation, pump 66 is operated to establish a pressure in chamber 54 that is approximately 30 milliTorr (mT). Mass flow controllers 84 and 85 are operated to establish a flow rate from supplies 76 and 77, respectively. Specifically, supply 76 provides a flow of $CF_4$ gas into chamber 54 at approximately 90 standard cubic centimeters per minute (sccm). Supply 77 provides a flow of oxygen, $O_2$, gas into processing region at approximately 10 sccm. Power supply 62 is operated at 300 Watts. This configuration results in semi-conformal layer 29 and smoothing layer 40 etching at substantially the same rates, e.g., semi-conformal layer 29 etches at approximately 161.3 nm/minute±10 nm/minute, and smoothing layer 40 etches at approximately 167.4 nm/minute±10 nm/minute. It is desired to minimize the time required to complete etching, i.e., to expose surfaces 32 and 34.

Figure 7:
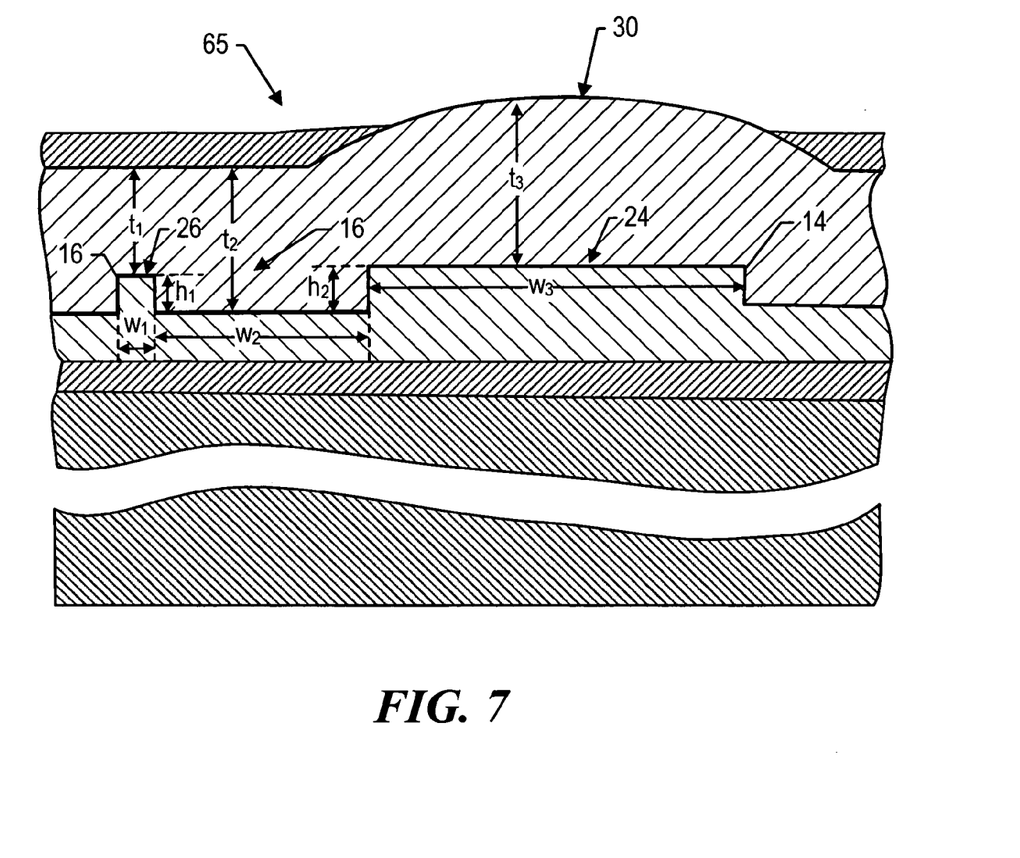
FIG. 7 is a cross-sectional view of the substrate shown in FIG. 5 after being etched employing first etch conditions in accordance with the present invention.

Referring to both FIGS. 6 and 7 to minimize the time required to complete etching, a sequential etch process is employed to maximize the etch rate of materials being etched while minimizing the etch rate differential among materials undergoing etch. The sequential etch process includes a first etch condition that minimizes the time required to remove portions of smoothing layer 40. To that end, pump 66 operates to establish a pressure in chamber 54 that is approximately 40 mT. Mass flow controllers 83, 85 and 87 are operated to establish a flow rate from supplies 75, 77 and 79, respectively. Specifically, supply 75 provides a flow of $C_2H_4$ gas into chamber 54 at approximately 40 sccm, and supply 77 provides a flow of oxygen, $O_2$, gas into chamber 54 at approximately 100 sccm. Supply 79 provides a flow of nitrogen, $N_2$, gas into chamber 54 at approximately 200 sccm. Supply 62 is operated at 500 Watts. These process conditions are maintained to form a multi-material semi-planar surface 65 that includes SEMI-CONFORMAL MATERIAL, resulting from the exposure of surface 30, and the remaining regions of SMOOTHING LAYER MATERIAL. After forming semi-planar surface 65, the etch process is terminated and the process conditions changed. Formation of semi-planar surface 65 may be determined from a priori knowledge in which the time required to expose the same is known and the process conditions are terminated after the required time had lapsed. To that end, a process conditions monitoring system 96 may be in communication with chamber 54 which is configured to measure performance of the etch process, e.g., measure an etch rate, an etch selectivity, an etch uniformity, feature profile angle, and critical dimension. System 96 may be an in-situ or ex-situ device. In the case of an in-situ device, system 96 includes a scatterometer (not shown), incorporating beam profile ellipsometry and beam profile reflectometry. The scatterometer (not shown) may be positioned within a transfer chamber (not shown). In the case of an ex-situ device, system 96 includes a scanning electron microscope (not shown).

Operation of reactor 50 is achieved by a controller 98 in data communication therewith to control the operations of the systems associated with reactor 50. To that end, controller 98 is in data communication with RF supply 62, pump 66, throttle valve 68, mass flow controllers 83-90, supplies 75-82 and process condition monitoring system 96. Controller 102 includes a microprocessor (not shown), memory (not shown), and a digital i/o port (not shown) that is capable of generating control voltages sufficient to communicate with reactor 50. A program stored in the memory (not shown) and selectively operated on by microprocessor controls the operation of reactor 50.

The processing conditions in chamber 54 are established so that semi-conformal layer 29 and the remaining portions of smoothing layer 40 are etched at substantially the same rate. To that end, the chamber pressure is approximately 30 mT, power supply 62 is operated at 300 Watts and oxygen, $O_2$, gas is flowed into chamber 54 at approximately 10 sccm and $CF_4$ gas is flowed into chamber 54 at approximately 90 sccm. Upon removal of substantially all of the remaining portions of smoothing layer 40, the DOP of 60% is maintained in a surface 130, which is defined by the remaining portions of semi-conformal layer 29. As a result the maximum thickness of $t_6$ of the remaining portion of hill 34 is less than thickness $t_3$. Specifically, thickness $t_6$ is defined substantially as follows:

$$t_6 = t_3 - (d_1 - d_2) \quad \quad 3)$$

Thus, the smaller the value of $d_2$, the greater the degree of planarization in multi-material semi-planar surface 65 afforded by smoothing layer 40.

Figure 8:
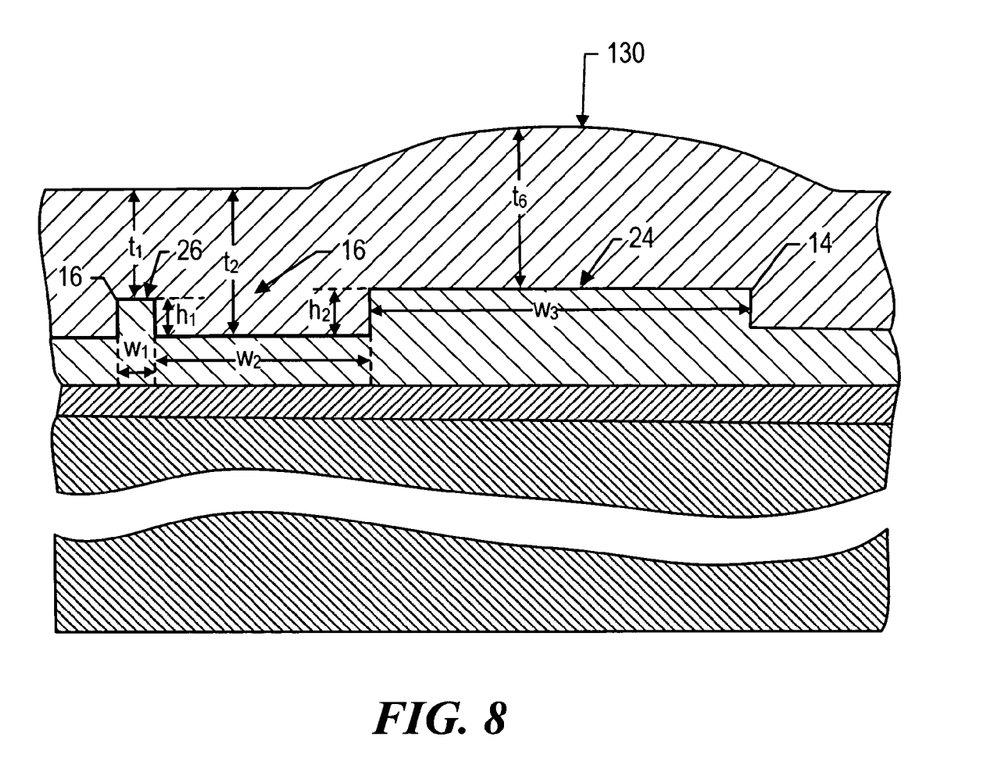
FIG. 8 is a cross-sectional view of the substrate shown in FIG. 7 after being etched employing second etch conditions in accordance with the present invention.

Referring to FIGS. 2, 6 and 8 following formation of surface 130, etch conditions are changed to maximize the etch rate of the remaining portions of semi-conformal layer 29 while forming crown surface 25 and maximizing the planarity thereof. To that end, chamber 54 is pressurized to 50 mT, power supply 62 is operated at 500 Watts, and supply 75 provides $C_4F_8$ gas into chambers 54 at approximately 10 sccm. Supply 77 provides oxygen gas into chamber 54 at approximately 20 sccm, and supply 78 provides Argon gas into chamber 54 at approximately 100 sccm.

Following formation of crown surface 25, patterned layer 22 may be etched establishing conditions in chamber 54 such that chamber pressure is 15 mT, power supply 62 is operated at 120 Watts and supply 82 introduces CO gas into chamber 54 at a rate of 100 sccm. Supply 77 introduces oxygen, $O_2$, gas into chamber 54 at a rate of approximately 20 sccm to take advantage of the etch differential provided by regions 24 and 28, as discussed in U.S. patent application Ser. No. 10/789,319, filed Feb. 27, 2004, entitled, COMPOSITIONS FOR AN ETCHING MASK COMPRISING A SILICON-CONTAINING MATERIAL, having Frank Y. Xu, Michael N. Miller and Michael P. C. Watts listed as inventors, which is incorporated by reference herein.

The embodiments of the present invention described above are exemplary. Many changes and modifications may be made to the disclosure recited above while remaining within the scope of the invention. For example, in lieu of the SMOOTHING LAYER BULK MATERIAL DISCUSSED ABOVE, a T-structure silicone resin from Dow Corning Company, Midland, Mich. sold under the product name Z-6018 may be employed. In this manner Z-6018 would comprise 100% of the bulk material. The smoothing composition would comprise 20% Z-6018 and 80% of the methyl amyl ketone available from Aldrich Co. (St. Louis, Mo.) under the tradename MAK.

Employing the spin-coating system discussed above, the Z-6018 smoothing composition is centrally disposed on surface 30 before rotation occurs. After dispensing of the smoothing composition, substrate 10 is accelerated to 5,000 rpm/s to reach a maximum rotational velocity of approximately 2,500 rpm. The maximum rotational velocity is maintained until substantially all of the solvent in the polymerizable composition has been removed. This is detected optically by the unaided eye as the color of semi-conformal layer 29 remains substantially unchanged during rotation of substrate 10. At these process conditions semi-conformal layer 29 is solidified and will not level. To achieve leveling of semi-conformal layer 29, the substrate 10 is baked in an oven at 1200 Celsius for fifteen minutes during which time semi-conformal layer 29 becomes fluidic, e.g., reflows, to facilitate leveling of smoothing surface 44. Cooling is achieved by placing the same on an air-cooled cold plate having flows of ambient air directed toward substrate 10 for two minutes to solidify semi-conformal layer 29.

The scope of the invention should not, therefore, be limited by the above description, but instead should be determined with reference to the appended claims along with their full scope of equivalents.

What is claimed is:

1. A method of etching a multi-layer structure formed from a layer of a epoxy-containing material and a layer of a polysiloxane-containing material differing from said epoxy-containing material, said method comprising:

creating a first set of process conditions to etch said epoxy-containing material;

generating a second set of process conditions to etch said polysiloxane-containing material; and establishing an additional set of process conditions to concurrently etch said epoxy-containing and polysiloxane-containing material at substantially the same etch rate.

2. The method as recited in claim 1 wherein establishing occurs after creating and before generating.

3. The method as recited in claim 1 wherein creating further includes producing said first set of process conditions to achieve a maximum etch rate of a said epoxy-containing material.

4. The method as recited in claim 1 wherein generating further includes producing said second set of process conditions to achieve a maximum etch rate of said polysiloxane-containing material.

5. The method as recited in claim 1 wherein creating further includes producing said epoxy-containing set of process conditions to etch said epoxy-containing material and expose a multi-material surface containing both said epoxy-containing and polysiloxane-containing materials and establishing further includes producing said additional set of process conditions to concurrently etch said epoxy-containing and polysiloxane-containing material at substantially the same etch rate to remove substantially all of said epoxy-containing material to produce a semi-planar surface substantially all of which is formed from said polysiloxane-containing material, and generating a second set of process conditions further includes producing said second set of process conditions to form, from said semi-planar surface, a planarized surface.

6. The method as recited in claim 5 wherein said multi-layered structure includes a smoothing surface having a degree of planarization associated therewith, with establishing further including producing said additional set of process conditions to create a reveal layer with said degree of planarization.

7. A method of etching a multi-layer structure formed from a layer of a first material and a layer of a second material differing from said first material, said method comprising:

creating a first set of process conditions to achieve a maximum etch rate said first material to expose a multi-material surface containing both said first and second materials;

exposing said multi-material surface to an additional set of process conditions to concurrently etch said first and second material at substantially the same etch rate to remove substantially all of said first material exposing a semi-planar surface substantially all of which comprises of said second material; and generating a second set of process conditions to etch said semi-planar surface to form a planarized surface.

8. The method as recited in claim 7 wherein said second material comprises a polysiloxane-containing material and said first material comprises an epoxy-containing material.

9. The method as recited in claim 7 wherein creating further includes producing said first set of process conditions to achieve a maximum etch rate of an epoxy-containing material.

10. The method as recited in claim 7 wherein generating further includes producing said second set of process conditions to achieve a maximum etch rate of a polysiloxane-containing material.

11. The method as recited in claim 7 wherein said multi-layer structure includes a smoothing layer having a degree of planarization associated therewith, with exposing further in including producing said additional set of process condition to provide said semi-planar surface with said degree of planarization.

12. A method of etching a multi-layer structure formed from a layer of a epoxy-containing material and a layer of a polysiloxane-containing material differing from said epoxy-containing material, said method comprising:

providing a surface of said multi-layer material with a degree of planarization; and establishing process conditions to concurrently etch said epoxy-containing and polysiloxane-containing material to remove said epoxy-containing material to generate a planarized surface of said polysiloxane-containing material having said degree of planarization, wherein establishing further includes creating a first set of process conditions to etch said epoxy containing material to expose a multi-material surface containing both said epoxy-containing and polysiloxane-containing materials, establishing an additional set of process conditions to currently etch said epoxy-containing and polysiloxane-containing material at substantially the same etch rate to remove substantially all of said epoxy containing material, and generating a second set of process conditions to etch said polysiloxane material to form said planarized surface.

* * * * *